United States Patent
He

(10) Patent No.: US 11,742,798 B2
(45) Date of Patent: Aug. 29, 2023

(54) OSCILLATION DEVICE AND ELECTRONIC DEVICE

(71) Applicant: SPREADTRUM COMMUNICATIONS (SHANGHAI) CO., LTD., Shenzhen (CN)

(72) Inventor: Chuan He, Shenzhen (CN)

(73) Assignee: SPREADTRUM COMMUNICATIONS (SHENZHEN) CO., LTD., Shenzhen (CN)

(*) Notice: Subject to any disclaimer, the term of this patent is extended or adjusted under 35 U.S.C. 154(b) by 0 days.

(21) Appl. No.: 17/692,564

(22) Filed: Mar. 11, 2022

(65) Prior Publication Data

US 2022/0200528 A1  Jun. 23, 2022

Related U.S. Application Data

(63) Continuation of application No. PCT/CN2020/110186, filed on Aug. 20, 2020.

(30) Foreign Application Priority Data

Sep. 12, 2019 (CN) .......................... 201910864681.9

(51) Int. Cl.
   *H03B 5/08* (2006.01)
   *G01P 3/48* (2006.01)
   *H03B 5/04* (2006.01)

(52) U.S. Cl.
   CPC ................. *H03B 5/08* (2013.01); *G01P 3/48* (2013.01); *H03B 5/04* (2013.01); *H03B 2200/004* (2013.01)

(58) Field of Classification Search
   CPC ....................................................... H03B 5/08
   (Continued)

(56) References Cited

U.S. PATENT DOCUMENTS

2019/0173427 A1* 6/2019 Marchand ................ H03B 5/04
2020/0021243 A1* 1/2020 Uehara .................. H03B 5/368

FOREIGN PATENT DOCUMENTS

CN     104467674 A      3/2015
CN     105828577 A      8/2016
           (Continued)

OTHER PUBLICATIONS

International Search Report issued in corresponding international application No. PCT/CN2020/110186 dated Nov. 25, 2020.

*Primary Examiner* — Joseph Chang
(74) *Attorney, Agent, or Firm* — Dave Law Group LLC; Raj S. Dave

(57) ABSTRACT

An oscillation device and an electronic device are provided. The oscillation device is applied to the electronic device. The electronic device includes a fan. The oscillation device includes a detection module, an oscillation module, a variable capacitance module, and a control module. The control module is electrically coupled with the detection module, the variable capacitance module, and the oscillation module. The control module is configured to determine a capacitance adjustment parameter according to a preset correspondence, and a temperature of the electronic device and/or a rotational speed of the fan, where the preset correspondence includes a correspondence between capacitance adjustment parameters and temperatures of the electronic device and/or rotational speeds of the fan. The control module is configured to adjust a capacitance of the variable capacitance module according to the capacitance adjustment parameter.

18 Claims, 7 Drawing Sheets

(58) Field of Classification Search
USPC .......................................................... 331/36 C
See application file for complete search history.

(56) References Cited

FOREIGN PATENT DOCUMENTS

| | | |
|---|---|---|
| CN | 106603011 A | 4/2017 |
| CN | 106930964 A | 7/2017 |
| CN | 208507477 U | 2/2019 |
| KR | 20060032891 A | 4/2006 |

* cited by examiner

OSCILLATION DEVICE AND ELECTRONIC DEVICE

CROSS-REFERENCE TO RELATED APPLICATION(S)

This application is a continuation of International Application No. PCT/CN2020/110186, filed Aug. 20, 2020, which claims priority to Chinese Patent Application No. CN201910864681.9, filed Sep. 12, 2019, the disclosures of which are hereby incorporated by reference in their entireties.

TECHNICAL FIELD

This disclosure relates to the technical field of integrated circuits, and particularly to an oscillation device and an electronic device.

BACKGROUND

A passive crystal oscillator, also known as a passive crystal resonator, is part of an oscillating circuit. The passive crystal oscillator has a piezoelectric wafer inside and is encapsulated outside, and the encapsulation plays a role of shock absorption, protection, and even sealing. Based on a piezoelectric effect of a wafer, electrodes are plated on both sides of a cut wafer to form the piezoelectric wafer. An electric field is applied between the electrodes through an external circuit, to cause mechanical deformation of the wafer, and accordingly, an electric field is generated in a corresponding direction under action of the mechanical deformation. If an external input is an alternating voltage, mechanical deformation vibration will occur, and finally an alternating electric field is generated at an output end. Once a frequency of the applied alternating voltage is equal to a natural frequency of the designed wafer, the amplitude of the mechanical vibration will reach a peak value, and the wafer will enter a stable piezoelectric resonance state. The passive crystal oscillator is relatively simple to design and manufacture, and crystal oscillators with a same design scheme can cooperate, within a maximum drive power range, with an appropriate resistance-capacitance-inductance circuit to output reference clock signals with different signal voltages. Therefore, the passive crystal oscillator can be widely used in integrated circuits (IC). In contrast, a passive quartz crystal oscillator is more suitable for general applications and high-volume product lines because of its low price and high precision.

The passive crystal oscillator is easily affected by external mechanical vibration and temperature, which may cause output frequency shift. As a result, problems such as inaccurate frequency output and poor synchronization efficiency between systems arise due to the system synchronizing an inaccurate clock frequency.

SUMMARY

In view of this, the disclosure provides an oscillation device. The oscillation device is applied to an electronic device. The electronic device includes a fan. The oscillation device includes a detection module, an oscillation module, a variable capacitance module, and a control module. The detection module is configured to detect a temperature of the electronic device and/or a rotational speed of the fan. The oscillation module is configured to oscillate to output a clock signal, where a frequency of the clock signal varies with a capacitance of the variable capacitance module. The variable capacitance module is electrically coupled with the oscillation module. The control module is electrically coupled with the detection module, the variable capacitance module, and the oscillation module. The control module is configured to determine a capacitance adjustment parameter according to a preset correspondence, and the temperature of the electronic device and/or the rotational speed of the fan, where the preset correspondence includes a correspondence between the capacitance adjustment parameter and the temperature of the electronic device and/or the rotational speed of the fan. The control module is configured to adjust the capacitance of the variable capacitance module according to the capacitance adjustment parameter.

In some possible implementations, the control module configured to determine the capacitance adjustment parameter according to the preset correspondence, and the temperature of the electronic device and/or the rotational speed of the fan is configured to: determine the capacitance adjustment parameter according to the temperature of the electronic device and the preset correspondence, on condition that the temperature of the electronic device is lower than or equal to a first temperature.

In some possible implementations, the control module configured to determine the capacitance adjustment parameter according to the preset correspondence, and the temperature of the electronic device and/or the rotational speed of the fan is configured to: determine the capacitance adjustment parameter according to the temperature of the electronic device, the rotational speed of the fan, and the preset correspondence, on condition that the temperature of the electronic device is higher than the first temperature.

In some possible implementations, the preset correspondence further comprises a correspondence between a fan drive mode, the temperature of the electronic device, and the rotational speed of the fan, and the capacitance adjustment parameter, where the fan drive mode comprises a pulse width modulation (PWM) signal drive mode and a direct current (DC) signal drive mode.

In some possible implementations, the control module is further configured to: detect the fan drive mode of the electronic device; and determine the capacitance adjustment parameter according to the fan drive mode of the electronic device, the temperature of the electronic device, the rotational speed of the fan, and the preset correspondence.

In some possible implementations, the detection module comprises a temperature sensor and/or a rotational speed sensor, the temperature sensor is configured to detect the temperature of the electronic device, and the rotational speed sensor is configured to detect the rotational speed of the fan.

In some possible implementations, the variable capacitance module comprises a varactor diode and a variable capacitor.

In some possible implementations, the oscillation module comprises a passive crystal oscillator.

In some possible implementations, the variable capacitance module is connected in parallel with the oscillation module.

In another aspect of the disclosure, an electronic device is provided. The electronic device includes a fan and the above oscillation device.

By adopting the oscillation device of the disclosure, the capacitance adjustment parameter is determined according to the preset correspondence, and the temperature of the electronic device and/or the rotational speed of the fan, where the preset correspondence includes a correspondence between the capacitance adjustment parameter and the temperature of the electronic device and/or the rotational speed of the fan. The capacitance of the variable capacitance module is adjusted according to the capacitance adjustment parameter. As such, influences of temperature and vibration on the oscillation module can be reduced, so that the oscillation device can output a clock signal with an accurate frequency under different temperature and vibration conditions, thereby improving an environmental adaptability of the device and ensuring that the electronic device can work normally.

Exemplary implementations will be described in detail with reference to accompanying drawings described below, and other features and aspects of the disclosure will become clear.

BRIEF DESCRIPTION OF THE DRAWINGS

Accompanying drawings contained in the specification and constituting a part of the specification together with the specification illustrate exemplary implementations, features, and aspects of the disclosure, and are used to explain the principles of the disclosure.

DETAILED DESCRIPTION

Figure 1:
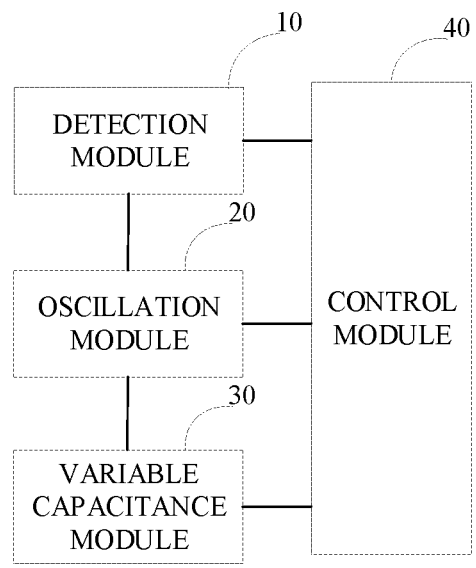
FIG. 1 is a block diagram illustrating an oscillation device according to implementations of the disclosure.

Hereinafter, exemplary implementations, features, and aspects of the disclosure will be described in detail with reference to accompanying drawings. The same reference numerals in the accompanying drawings denote elements having a same or similar function. While various aspects of the implementations are illustrated in the accompanying drawings, the accompanying drawings are not necessarily drawn to scale unless otherwise indicated.

The term "exemplary" referred to herein means "serving as an example, implementation, or illustration". Any implementation described herein as "exemplary" is not necessarily to be construed as preferred or advantageous over other implementations.

In addition, in order to better illustrate the disclosure, various specific details are given in the detailed implementations described below. Those skilled in the art should understand that the disclosure can also be implemented without certain specific details. In some implementations, methods, means, components, and circuits well known to those skilled in the art have not been described in detail, to highlight the subject matter of the disclosure.

Referring to FIG. 1, FIG. 1 is a block diagram illustrating an oscillation device according to implementations of the disclosure.

The oscillation device of the disclosure can be applied to an electronic device. The electronic device may include a terminal. The terminal may refer to various forms of access terminals, subscriber units, user equipment, subscriber stations, mobile stations (MS), remote stations, remote terminals, mobile equipment, user terminals, terminal equipment, wireless communication equipment, user agents, or user device. The user equipment may also be a cellular radio telephone, a cordless telephone, a session initiation protocol (SIP) telephone, a wireless local loop (WLL) station, a personal digital assistant (PDA), handheld equipment with a wireless communication function, computing equipment or other processing equipment connected with a wireless modem, on-board equipment, wearable equipment, user equipment in the future 5G network or terminal equipment in the future evolved public land mobile network (PLMN), etc., which is not limited in implementations of the disclosure.

Figure 7:
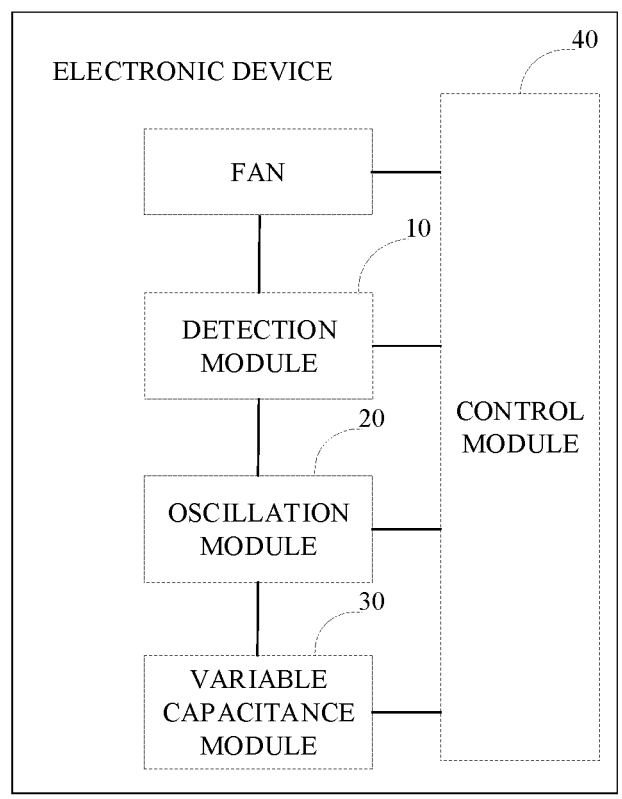
FIG. 7 is a schematic diagram illustrating an electronic device according to implementations of the disclosure.

The electronic device includes a fan, see FIG. 7. The oscillation device includes a detection module 10, an oscillation module 20, a variable capacitance module 30, and a control module 40. The detection module 10 is configured to detect a temperature of the electronic device and/or a rotational speed of the fan. The oscillation module 20 is configured to oscillate to output a clock signal, where a frequency of the clock signal varies with a capacitance of the variable capacitance module 30. The variable capacitance module 30 is electrically coupled with the oscillation module 20. The control module 40 is electrically coupled with the detection module 10, the variable capacitance module 30, and the oscillation module 20. The control module 40 is configured to determine a capacitance adjustment parameter according to a preset correspondence, and the temperature of the electronic device and/or the rotational speed of the fan, where the preset correspondence includes a correspondence between the capacitance adjustment parameter and the temperature of the electronic device and/or the rotational speed of the fan. The control module 40 is configured to adjust the capacitance of the variable capacitance module 30 according to the capacitance adjustment parameter.

By adopting the oscillation device of the disclosure, the capacitance adjustment parameter is determined according to the temperature of the electronic device and/or the rotational speed of the fan, and the preset correspondence, where the preset correspondence includes a correspondence between the capacitance adjustment parameter and the temperature of the electronic device and/or the rotational speed of the fan. The capacitance of the variable capacitance module is adjusted according to the capacitance adjustment parameter. As such, influences of temperature and vibration on the oscillation module can be reduced, so that the oscillation device can output a clock signal with an accurate frequency under different temperature and vibration conditions, thereby improving an environmental adaptability of the device and ensuring that the electronic device can work normally.

It should be understood that, the oscillation device may further include a storage device (not illustrated), which can be used to save the preset correspondence.

The preset correspondence of the disclosure may be in a form of a calculation formula, a curve, a table, etc. The specific form of the preset correspondence is not limited in the disclosure, as long as the capacitance adjustment parameter can be determined according to the preset correspondence, and the temperature of the electronic device and/or the rotational speed of the fan.

It should be understood that, a clock signal outputted by the oscillation device of the disclosure may be a frequency signal outputted by a passive crystal oscillator in the oscillation module, or may have a carrier frequency (which may be multiple times an output frequency of the passive crystal oscillator) which is synthesized or modulated with the frequency signal outputted by the passive crystal oscillator.

The oscillation device of the disclosure can adjust the capacitance of the variable capacitance module as an operating state of the electronic device changes, and the adjusting of the capacitance may be real-time and continuous.

In some possible implementations, the variable capacitance module 30 may include a varactor diode, a variable capacitor, and the like. The variable capacitor may include a variable capacitance array. Accordingly, the capacitance adjustment parameter may be any parameter capable of changing the capacitance of the variable capacitance module, such as a voltage, a current, etc. The variable capacitance module may be connected in parallel with the oscillation module to change a load capacitance of the oscillation module. An equivalent capacitance of the oscillation module varies with the environment (e.g., a temperature, a rotational speed), which causes change of an oscillation frequency. The load capacitance of the oscillation module can be adaptively changed according to change of the environment through the variable capacitance module, so that the load capacitance and the equivalent capacitance are as close as possible, to keep an output frequency of the oscillation module stable.

In other implementations, the variable capacitance module 30 may also be implemented in other manners, as long as capacitance change can be implemented and a required capacitance can be obtained according to the capacitance adjustment parameter.

In some possible implementations, the oscillation module may include a passive crystal oscillator.

In order to meet a resonance condition, an equivalent capacitance across a passive crystal oscillator needs to be close to or equal to a load capacitance of the passive crystal oscillator, so that an oscillation frequency of the passive crystal oscillator can be relatively close to a target value. Otherwise, the oscillation frequency of the passive crystal oscillator will be shifted.

Environmental factors that affect operation of the oscillation module may include an operating temperature, mechanical vibration, and shock. These factors generally cause change of an output frequency and increased instability, and in extreme cases, can cause the oscillation module to stop vibrating. For an integrated circuit (IC) sensitive to a reference clock, such as a digital signal processor (DSP) of communication equipment, a graphics processing unit (GPU) of a display, and a central processing unit (CPU) that provides main computing power for a high-performance workstation, if a passive crystal oscillator is used, it is necessary to ensure that a clock signal outputted by the oscillator module is accurate, to ensure that the IC can work normally.

In the disclosure, the capacitance of the variable capacitance module can be adjusted according to the temperature and/or the rotational speed of the fan, so that the equivalent capacitance of the oscillation module is close to or equal to the load capacitance of the oscillation module. As such, an oscillation frequency of the oscillation module can be close to or equal to the target value, which can avoid shifting of the oscillation frequency of the oscillation module, thereby ensuring normal operation of the IC or the electronic device.

In some possible implementations, the control module 40 may be a microcontroller unit (MCU), or a dedicated circuit, which is not limited in the disclosure.

In some possible implementations, the detection module 10 includes a temperature sensor and/or a rotational speed sensor. The temperature sensor is configured to detect the temperature of the electronic device, and the rotational speed sensor is configured to detect the rotational speed of the fan.

When the temperature sensor obtains the temperature of the electronic device, the temperature may be converted into a digital signal with an analog-to-digital converter (ADC).

Similarly, when the rotational speed sensor obtains the rotational speed of the fan, the rotational speed may be converted into a digital signal with the ADC.

The temperature sensor and the rotational speed sensor are not limited in the disclosure, which can be selected by those skilled in the art according to actual needs.

Of course, some electronic devices (or ICs) may integrate a core temperature detection circuit or an encapsulated temperature detection circuit inside, so an operating temperature of the electronic device can be measured with the built-in temperature detection circuit. Once a threshold temperature is reached, a command is sent to turn on a cooling fan. A thermal circuit may also be designed to detect the operating temperature. The output of the thermal circuit is coupled with an ADC pin of the control module (e.g., a microcontroller) to obtain an electrical signal converted from the temperature, to confirm the operating temperature of the electronic device. That is, in the disclosure, the temperature of the electronic device can also be detected with the equipped temperature detection circuit of the electronic device itself.

The temperature of the electronic device of the disclosure may include a temperature of a chip, or a temperature of each operating component of the electronic device, or a temperature of the entire electronic device.

Similarly, in the disclosure, the rotational speed of the fan of the electronic device can also be obtained with an equipped rotational speed detection circuit of the electronic device.

In some possible implementations, determining the capacitance adjustment parameter according to the preset correspondence, and the temperature of the electronic device and/or the rotational speed of the fan includes: determining the capacitance adjustment parameter according to the temperature of the electronic device and the preset correspondence, on condition that the temperature of the electronic device is lower than or equal to a first temperature.

By adopting the oscillation device of the disclosure, on condition that the oscillation module 20 is only affected by temperature, the temperature of the electronic device is obtained, and the capacitance adjustment parameter is determined according to the temperature of the electronic device and the preset correspondence, to adjust the capacitance of the variable capacitance module, so that the oscillation module can output a stable and accurate clock signal.

As an example, the first temperature may be a room temperature (an ambient temperature), and the disclosure does not limit the specific magnitude of the first temperature. For different environments, the magnitude of the first temperature may be different.

On condition that the temperature of the electronic device is lower than or equal to the first temperature, the fan of the electronic device will not be turned on. In this case, the fan does not need to be turned on for cooling because the temperature of the electronic device is not high.

In other words, in this case, the oscillation module 20 is only affected by temperature.

In some possible implementations, those skilled in the art can obtain in advance a preset correspondence between the temperature of the electronic device and the capacitance adjustment parameter through methods such as tests and experiments, on condition that the temperature of the electronic device is lower than or equal to the first temperature.

The obtaining of the preset correspondence between the temperature of the electronic device and the capacitance adjustment parameter will be exemplarily introduced below.

In some possible implementations, determining the capacitance adjustment parameter according to the preset correspondence, and the temperature of the electronic device and/or the rotational speed of the fan includes: determining the capacitance adjustment parameter according to the temperature of the electronic device, the rotational speed of the fan, and the preset correspondence, on condition that the temperature of the electronic device is higher than the first temperature.

By adopting the oscillation device of the disclosure, on condition that the oscillation module is simultaneously affected by temperature and vibration (e.g., a rotation speed), the temperature of the electronic device and the rotational speed of the fan are obtained, and the capacitance adjustment parameter is determined according to the temperature of the electronic device, the rotational speed of the fan, and the preset correspondence, to adjust the capacitance of the variable capacitance module. As such, influences of temperature and vibration on the oscillation module can be reduced, and therefore, the oscillation module can output a stable and accurate clock signal.

On condition that the temperature of the electronic device is higher than the first temperature, the fan will be turned on to cool down the electronic device. In this case, vibration occurs after the fan is turned on, which can affect oscillation of the oscillation module 20. Therefore, after the fan is turned on, the oscillation module 20 will be affected not only by the temperature of the electronic device, but also by the vibration of the fan.

In this case, the capacitance of the variable capacitance module 30 can be adjusted according to the temperature and the rotational speed of the fan, so that the load capacitance of the oscillation module 20 can match the equivalent capacitance of the oscillation module, which can achieve a stable output of the oscillation module 20 in different temperature and vibration states.

On condition that the temperature of the electronic device is higher than the first temperature, those skilled in the art can obtain in advance a preset correspondence between the temperature of the electronic device, the rotational speed of the fan, and the capacitance adjustment parameter through methods such as tests and experiments. As an example, those skilled in the art can obtain a correspondence between the temperature of the electronic device and the capacitance adjustment parameter, and then obtain, based on the correspondence between the temperature and the capacitance adjustment parameter, the preset correspondence between the temperature of the electronic device, the rotational speed of the fan, and the capacitance adjustment parameter.

In the following, the disclosure will exemplarily introduce the obtaining of the preset correspondence between the temperature of the electronic device, the rotational speed of the fan, and the capacitance adjustment parameter.

In some possible implementations, the preset correspondence may further include a correspondence between a fan drive mode, the temperature of the electronic device, the rotational speed of the fan, and the capacitance adjustment parameter, where the fan drive mode includes a pulse width modulation (PWM) signal drive mode and a direct current (DC) signal drive mode.

In some possible implementations, the oscillation module 20 further includes a tuning unit. The tuning unit may include a circuit composed of devices such as a capacitor, a resistor, an inductor, and an inverting amplifier, which can shape and amplify an output clock signal.

Figure 2A:
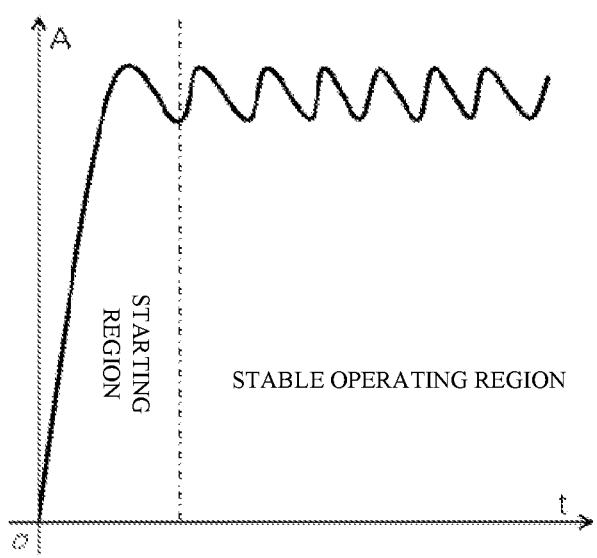
FIG. 2a is a schematic diagram illustrating an amplitude-time curve of a fan driven by a pulse width modulation (PWM) signal.

Referring to FIG. 2a, FIG. 2a is a schematic diagram illustrating an amplitude-time curve of a fan driven by a PWM signal.

As illustrated in FIG. 2a, the fan may be driven through PWM to adjust the rotational speed of the fan. In a turned-on period of a switch tube, the longer a turned-on duration, the greater an average of a DC output, and accordingly, the longer a speed increasing duration of the fan, the larger a total average rotational speed, and the higher a vibration frequency. A frequency of the PWM signal itself may range from several KHz to several hundreds of KHz.

In a starting region, the fan with PWM signal drive mode speed regulation increases the rotational speed according to a turned-on voltage, and its vibration frequency is related to an output voltage when the switch tube is turned on. The higher the voltage, the faster the rotational speed increases, and the higher the vibration frequency.

As illustrated in FIG. 2a, in a stable operating region, a parasitic frequency of vibration is related to a PWM frequency of a PWM controller, which may range from several KHz to several hundreds of KHz. A PWM turned-on voltage is constant, and an integral frequency varies with a duty cycle. Generally, a spectrum of the vibration frequency is relatively wide, and the oscillation frequency of the oscillation module will be affected when vibration energy is concentrated in the highest frequency band.

Figure 2B:
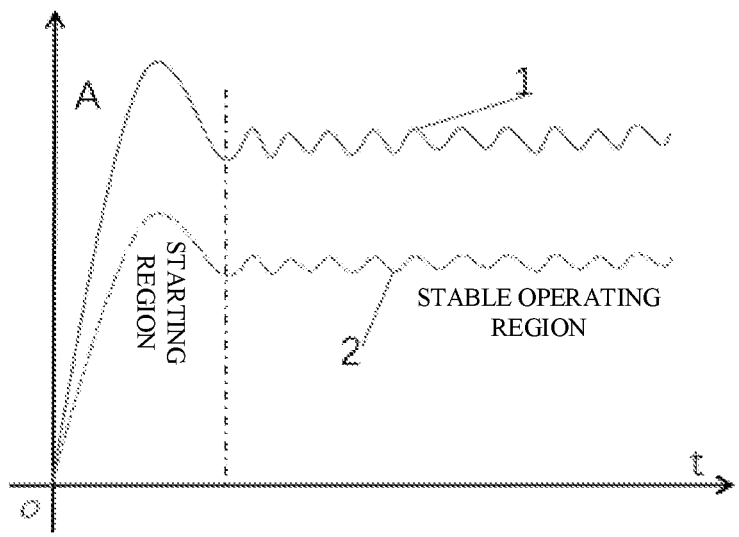
FIG. 2b is a schematic diagram illustrating an amplitude-time curve of a fan driven by a direct current (DC) signal.

Referring to FIG. 2b, FIG. 2b is a schematic diagram illustrating an amplitude-time curve of a fan driven by a DC signal.

The rotational speed and vibration of the fan with DC signal drive mode speed regulation are mainly affected by output power, which is more linear during operation, and an unstable component is mainly caused by a ripple. Generally, the ripple should be controlled within 5%. Therefore, as illustrated in FIG. 2b, in the stable operating region, a vibration frequency of the fan with DC signal drive mode speed regulation is relatively stable, and vibration energy is concentrated in a narrow frequency band.

Figure 2C:
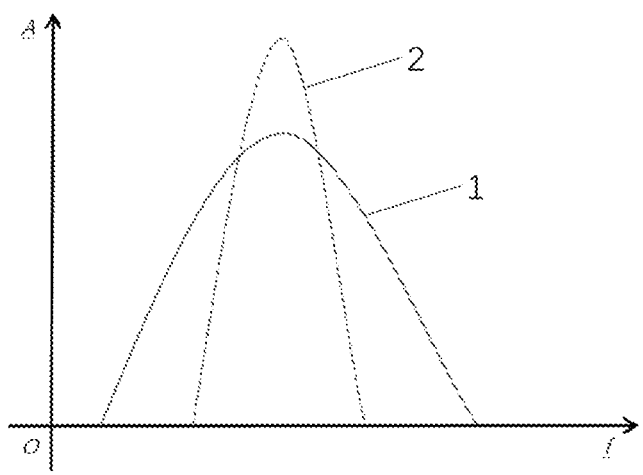
FIG. 2c is a schematic diagram illustrating comparison of oscillation spectrums of a fan in a PWM signal drive mode and a DC signal drive mode.

Referring to FIG. 2c, FIG. 2c is a schematic diagram illustrating comparison of oscillation spectrums of the fan in a PWM signal drive mode and a DC signal drive mode.

As illustrated in FIG. 2c, in actual compensation, to control frequency shift to be within a low range, the PWM signal drive mode speed regulation ("1" in FIG. 2c) and the DC signal drive mode speed regulation ("2" in FIG. 2c) only need to be compensated according to a center frequency. A specific compensation value of the frequency shift refers to an output signal of the oscillation module or a carrier frequency which is synthesized or modulated by a system with an output frequency of the oscillation module, and depends on measurement of an instrument with a spectrum-analyzer function.

It should be noted that, the foregoing description is exemplary. In other implementations, the fan may also be driven in other drive modes, which is not exhaustive in the disclosure.

In some possible implementations, the control module 40 is further configured to: detect a fan drive mode of the electronic device; and determine the capacitance adjustment parameter according to the fan drive mode of the electronic device, the temperature of the electronic device, the rotational speed of the fan, and the preset correspondence.

Those skilled in the art can determine, for different drive modes of the fan, preset correspondences between the temperature of the electronic device, the rotational speed of the fan, and the capacitance adjustment parameter. In different drive modes, the capacitance adjustment parameter can be obtained according to different preset correspondences, that is, a preset correspondence between the temperature, the rotational speed, and the capacitance adjustment parameter varies with a drive mode, so that the oscillation module 20 has a relatively stable output, which can improve an environmental adaptability and a flexibility of the oscillation device. The preset correspondences in different drive modes may be obtained in advance through methods such as tests and experiments.

In the following, how to obtain the preset correspondence will be exemplarily described. It should be understood that, the following description is exemplary, and those skilled in the art can also obtain the preset correspondence in other manners.

Figure 3:
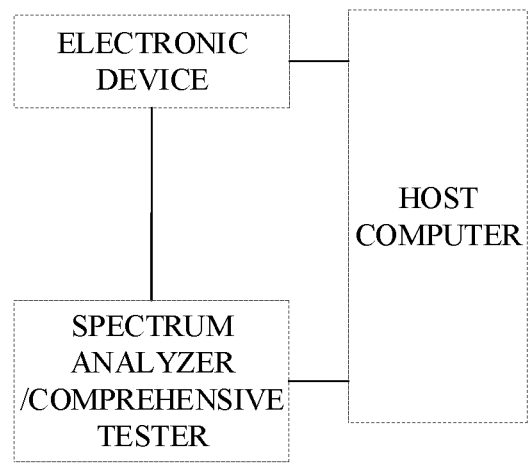
FIG. 3 is a schematic diagram illustrating a test device for obtaining a preset correspondence.

Referring to FIG. 3, FIG. 3 is a schematic diagram illustrating a test device for obtaining a preset correspondence.

As illustrated in FIG. 3, the test device may include a host computer, an electronic device, and a spectrum analyzer/comprehensive tester.

As an example, the host computer may be, for example, a computer (e.g., a personal computer, a desktop computer, etc.) or a server.

As an example, the electronic device may be any type of terminal.

Figure 4:
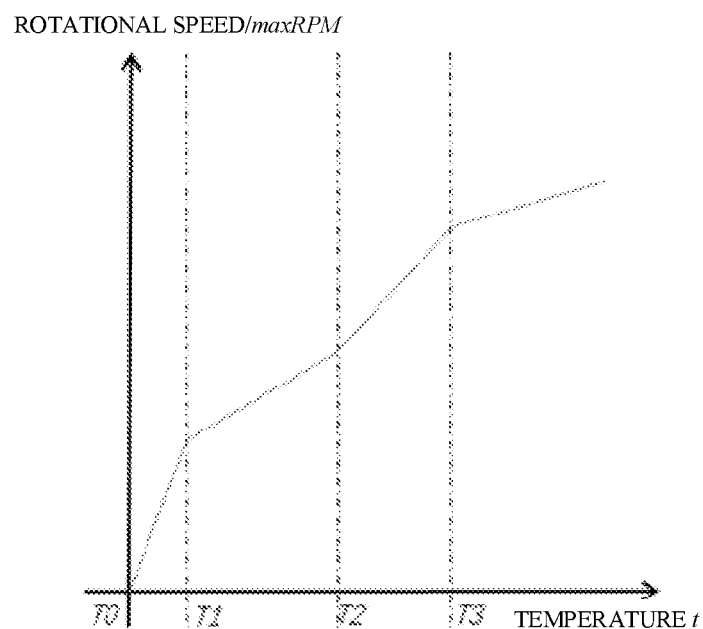
FIG. 4 is a schematic diagram illustrating rotational speeds and temperatures according to implementations of the disclosure.

Referring to FIG. 4, FIG. 4 is a schematic diagram illustrating rotational speeds and temperatures according to implementations of the disclosure.

During the test, the state of the electronic device may be classified into three operating states, that is, a standby state, an operating state, and a high-load operating state, and corresponding temperature thresholds T1, T2, T3 (as illustrated in FIG. 4) are set. If the temperature of the electronic device is lower than temperature threshold T1, the electronic device can be regarded as being in the standby state. If the temperature of the electronic device is lower than temperature threshold T2 and higher than temperature threshold value T1, the electronic device can be regarded as being in the operating state. If the temperature of the electronic device is lower than temperature threshold T3 and higher than temperature threshold T2, the electronic device can be regarded as being in the high-load operating state. The rotational speed varies with the operating state.

It should be noted that, the rotational speed of the disclosure refers to a rotational speed of the fan, that is, a rotational speed of a motor for driving rotation of the fan.

Of course, in other implementations, the operating state of the electronic device may be further classified. For example, the operating state may be further classified into a low-load operating state, a normal operating state, and the like.

For different temperatures, different operating modes of the fan are configured.

For example, the fan is configured to be turned on and turned off intermittently in the low-load operating state.

Figure 5:
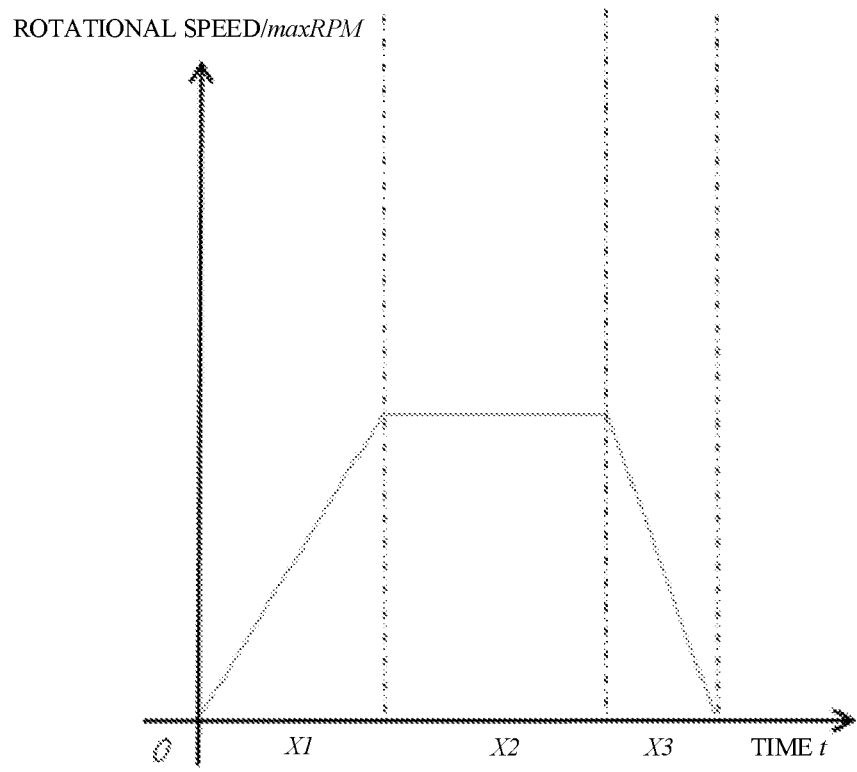
FIG. 5 is a schematic operating diagram of a fan in a low-load operating state according to implementations of the disclosure.

Referring to FIG. 5, FIG. 5 is a schematic operating diagram of a fan in a low-load operating state according to implementations of the disclosure.

If the highest temperature at which a system operates in the low-load operating state is temperature threshold T1 and the lowest temperature is temperature threshold T0, the fan is configured to dissipate heat at temperature threshold T1, and the fan is configured to stop operating once the temperature drops to T0.

In a stage of a room temperature (i.e., first temperature) →temperature threshold T0, since the fan does not operate, the compensation for the oscillation module may only include temperature compensation.

In a stage of temperature threshold T0→temperature threshold T1, the fan experiences a process of starting (X1)→stable operation (X2)→powered-off and speed decreasing (X3). In this situation, the compensation for the oscillation module may include temperature compensation and vibration (rotational speed) compensation.

If the fan starts to operate once the temperature reaches threshold temperature T0 and the cooling fan is set to be in an intermittent turn-on and turn-off mode in the stage of threshold temperature T0→threshold temperature T1, a control program is configured to send a command to start operation of the fan, a compensation curve (preset correspondence) when the room temperature rises to threshold temperature T0 is obtained. Then, in the stage of threshold temperature T0 to threshold temperature T1, a compensation curve in a starting stage of the fan (corresponding to section X1), a compensation curve when the fan operates stably (corresponding to section X2), and a curve when a power supply of the fan is off and the speed is decreasing (corresponding to section X3) are obtained.

In the disclosure, the rotational speed of the fan is increased from 0% to 100% during calibration, and compensation curves corresponding to all operating modes of the fan are traversed. In the oscillation device of the disclosure, the control module 40 can recognize a start and an end of a curve of three stages including a starting stage, a powered-off stage, and an operating stage of the fan. For example, at the start of section X1, a system temperature reaches threshold temperature T0. In this situation, the control module 40 sends a command to start operation of the cooling fan, and provides a PMW value or a DC value. During starting of the fan, the temperature drops slightly while the rotational speed of the fan increases rapidly. Such duration is relatively short, and once a compensation value reaches a peak value, section X1 ends and section X2 starts. In section X2, the temperature drops gradually while the rotational speed of the fan remains constant, and the influence of fan vibration is approximately constant. Once the temperature drops to threshold temperature T0, the fan stops rotating, section X2 ends and section X3 starts. In section X2, if the temperature reaches threshold temperature T2 due to high-load operation of the system, here is a midpoint of section X2 and the start of section YA1 where the rotational speed is increased, and so on.

Of course, the foregoing description is exemplary, which should not be construed as limiting of the disclosure.

Those skilled in the art may obtain the preset correspondence for temperature compensation and the preset correspondence for vibration compensation separately, and obtain the final preset correspondence for simultaneous compensation of temperature and vibration according to the preset correspondence for temperature compensation and the preset correspondence for vibration compensation.

Of course, the above only describes various stages corresponding to the low-load operating state. For other operating states, an operating mode configured for the fan is similar to a low-load operating mode and can include, for example, stages such as speed increasing, stabilization, speed decreasing, and turned-off.

As an example, in the disclosure, the workload of the electronic device can be increased by means of software, to control the temperature of the electronic device.

In the disclosure, the highest temperature in the low-load operating mode can be set as temperature threshold T1 (e.g., 25° C.), if a system load is 30% at this time, when the load is controlled to continue to increase, the fan will continue to increase the rotational speed until the system load reaches 100%. In the disclosure, the load ranging from 30% to 100% may be set as an interval, or may be divided into multiple intervals. At each interval, the fan may experience a process of speed increasing, constant speed, and speed decreasing. For each interval, a three-stage curve (correspondence) needs to be obtained and inserted into a compensation curve in a section of T0→T1. For example, the temperature rises to temperature threshold T2 (e.g., 45° C.) gradually, the temperature experiences a process of T0→T2→T0, the compensation curve corresponds to X1→X2→YA1→YA2→YA3→X3, where YA1 corresponds to a rising stage, YA2 corresponds to a stable stage, and YA3 corresponds to a falling stage. If an interval of temperature threshold T3 (e.g., 80° C.) is added, when the temperature experiences a process of T0→T3→T0, the compensation curve corresponds to X1→X2→YA1→YA2→YB1→YB2→YB3→YA3→X3, where YB1 corresponds to a rising stage, YB2 corresponds to a stable stage, and YB3 corresponds to a falling stage.

It should be noted that, the foregoing description is exemplary, which should not be construed as limiting of the disclosure.

In the disclosure, during the test, the electronic device can simulate load works (increasing system communication throughput or calculation amount) to increase the temperature of the electronic device through software programs, and obtain a temperature compensation curve (preset correspondence), to save to a system memory. In a second stage of fan vibration calibration, the compensation curve can be used.

After the temperature compensation curve is obtained, a frequency shift curve of vibration may be further calibrated.

Also, referring to FIG. 3, in the disclosure, the preset correspondence between the capacitance adjustment parameter and the temperature of the electronic device may be determined by the following methods. The host computer can send a command, to control the electronic device to set the capacitance of the variable capacitance module according to an initial capacitance adjustment parameter (which may be set according to actual needs, and is not limited in the disclosure), so that the oscillation module 20 outputs a clock signal (which may be a crystal oscillator signal or a synthetic signal outputted by a passive crystal oscillator). The spectrum analyzer/comprehensive tester can detect the clock signal and output the clock signal to the host computer. The host computer can adjust the capacitance of the variable capacitance module according to a frequency value of the clock signal in a preset manner (e.g., positive bias increasing, negative bias decreasing) and obtain a capacitance adjustment parameter A1 (at a present temperature, the clock signal outputted by the oscillation module meets a frequency requirement). The host computer can control the electronic device to increase the workload of the electronic device, and accordingly, the temperature of the electronic device starts to rise. Once the temperature of the electronic device is higher than a preset temperature (e.g., 1° C.), the host computer adjusts the capacitance of the variable capacitance module by using the capacitance adjustment parameter A1, and the oscillation module outputs the clock signal according to the capacitance adjustment parameter A1. The host computer can obtain the clock signal through the spectrum analyzer/comprehensive tester, adjust the capacitance of the variable capacitance module in the preset manner, and obtain a capacitance adjustment parameter A2, so that the clock signal outputted by the oscillation module meets the frequency requirement. At this time, the host computer can obtain, according to the capacitance adjustment parameter A1 and the capacitance adjustment parameter A2, capacitance adjustment parameters (A2−A1) when increasing a preset temperature.

By repeating the above process, the preset correspondence between the temperature of the electronic device and the capacitance adjustment parameter can be obtained. For example, the preset correspondence is Y=(K*T+A5), where T represents the temperature of the electronic device, K represents a slope, A5 represents a preset value, and Y represents the capacitance adjustment parameter.

Of course, the foregoing description is exemplary, and the preset correspondence may also be obtained in other manners and may also be in other forms, which is not limited in the disclosure.

After the preset correspondence between the temperature and the capacitance adjustment parameter is obtained, the electronic device may be further tested by using the preset correspondence obtained, to obtain the preset correspondence between the temperature, the rotational speed, and the capacitance adjustment parameter.

Also, referring to FIG. 3, the host computer can send a command, obtain a capacitance adjustment parameter at a room temperature according to the preset correspondence between the temperature and the capacitance adjustment parameter, and control the oscillation module of the electronic device to oscillate to output a clock signal. The host computer can increase the workload of the electronic device, and control the fan to start to operate. The host computer can continuously obtain a clock signal outputted by the oscillation module through the spectrum analyzer/comprehensive tester, and adjust the capacitance of the variable capacitance module in a preset manner according to a magnitude relationship between the obtained clock signal and a target clock signal. Once the clock signal outputted by the oscillation module is close to or equal to the target clock signal, a capacitance adjustment parameter and a rotational speed of the fan are obtained. The above test process can be repeated multiple times, to obtain the correspondence between the rotational speed of the fan and the capacitance adjustment parameter.

The preset correspondence may be obtained by combining (e.g., superimposing two curves) the correspondence between the rotational speed and the capacitance adjustment parameter and the correspondence between the temperature and the capacitance adjustment parameter.

Figure 6A:
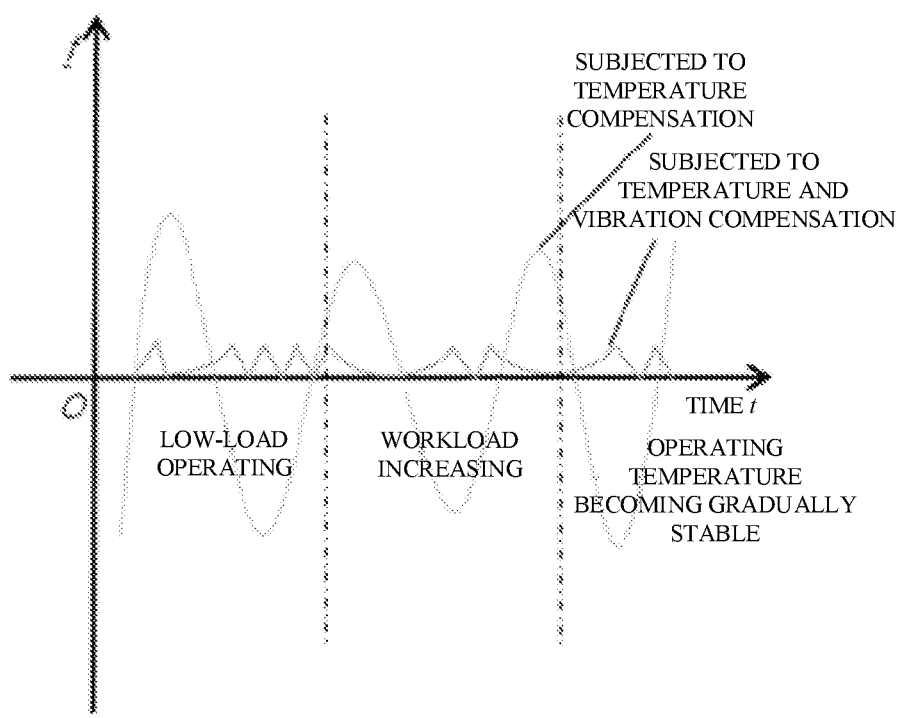
FIG. 6a is a schematic effect diagram illustrating output frequencies of an oscillation device of the disclosure.

Referring to FIG. 6a, FIG. 6a is a schematic effect diagram illustrating output frequencies of an oscillation device of the disclosure.

As illustrated in FIG. 6a, the fluctuation of a clock signal (which is obtained by adjusting the capacitance of the variable capacitance module according to the preset correspondence between the temperature and the capacitance adjustment parameter) is greater than the fluctuation of a clock signal (which is obtained by adjusting the capacitance of the variable capacitance module according to the preset correspondence between the temperature, the rotational speed of the fan, and the capacitance adjustment parameter).

As can be seen, in the disclosure, the adjusting of the capacitance of the variable capacitance module takes into account the temperature of the electronic device and the rotational speed of the fan, in other words, influences of various factors on the oscillation module are considered at the same time, which can ensure that the clock signal outputted by the oscillation module is relatively stable and accurate, thereby improving an adaptability and flexibility of environment transposition.

Figure 6B:
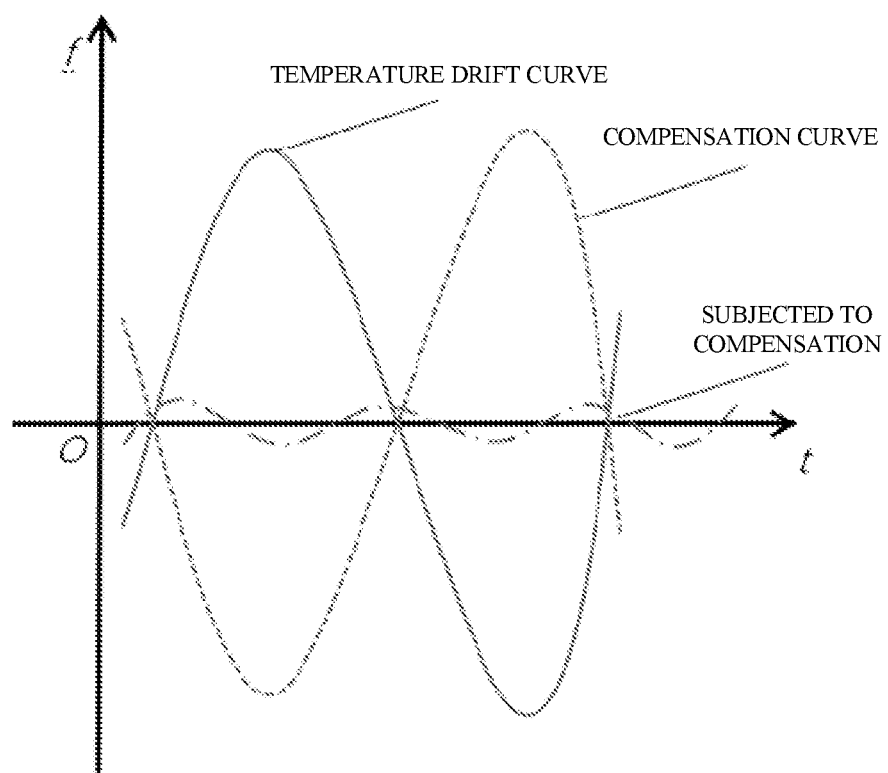
FIG. 6b is a schematic effect diagram illustrating output frequencies of an oscillation device of the disclosure.

Referring to FIG. 6b, FIG. 6b is a schematic effect diagram illustrating output frequencies of an oscillation device of the disclosure.

As illustrated in FIG. 6b, in the disclosure, curves under influences of different factors (e.g., a temperature, a rotational speed) can be combined into a compensation curve (preset correspondence), and a clock signal outputted by the oscillation module is adjusted by using the compensation curve, to compensate a temperature drift curve. Compared to the temperature drift curve unadjusted, the fluctuation of the temperature drift curve compensated is greatly reduced, and therefore, the clock signal outputted by the oscillation module is more stable.

Various implementations of the disclosure have been described above, the foregoing description is exemplary, not exhaustive, and the disclosure is not limited to the disclosed implementations. Modifications and variations will be apparent to those of ordinary skill in the art without departing from the scope and spirits of the implementations. The terminology used herein was chosen to best explain the principles of the implementations, the practical application, or improvement over the technology in the marketplace, or to enable others of ordinary skill in the art to understand the implementations disclosed herein.

What is claimed is:

1. An oscillation device, applied to an electronic device comprising a fan, the oscillation device comprising a detection module, an oscillation module, a variable capacitance module, and a control module, wherein:
   the detection module is configured to detect a temperature of the electronic device and/or a rotational speed of the fan;
   the oscillation module is configured to oscillate to output a clock signal, a frequency of the clock signal varies with a capacitance of the variable capacitance module;
   the variable capacitance module is electrically coupled with the oscillation module; and
   the control module is electrically coupled with the detection module, the variable capacitance module, and the oscillation module, and is configured to:
   determine a capacitance adjustment parameter according to a preset correspondence, and the temperature of the electronic device and/or the rotational speed of the fan, wherein the preset correspondence comprises a correspondence between the capacitance adjustment parameter and the temperature of the electronic device and/or the rotational speed of the fan, and the capacitance adjustment parameter is configured to change the capacitance of the variable capacitance module; and
   adjust the capacitance of the variable capacitance module according to the capacitance adjustment parameter.

2. The oscillation device of claim 1, wherein the control module configured to determine the capacitance adjustment parameter according to the preset correspondence, and the temperature of the electronic device and/or the rotational speed of the fan is configured to:
   determine the capacitance adjustment parameter according to the temperature of the electronic device and the preset correspondence, on condition that the temperature of the electronic device is lower than or equal to a first temperature.

3. The oscillation device of claim 1, wherein the control module configured to determine the capacitance adjustment parameter according to the preset correspondence, and the temperature of the electronic device and/or the rotational speed of the fan is configured to:
   determine the capacitance adjustment parameter according to the temperature of the electronic device, the rotational speed of the fan, and the preset correspondence, on condition that the temperature of the electronic device is higher than a first temperature.

4. The oscillation device of claim 1, wherein the preset correspondence further comprises a correspondence between a fan drive mode, the temperature of the electronic device, the rotational speed of the fan, and the capacitance adjustment parameter, wherein the fan drive mode comprises a pulse width modulation (PWM) signal drive mode and a direct current (DC) signal drive mode.

5. The oscillation device of claim 4, wherein the control module is further configured to:
   detect the fan drive mode of the electronic device; and
   determine the capacitance adjustment parameter according to the fan drive mode of the electronic device, the temperature of the electronic device, the rotational speed of the fan, and the preset correspondence.

6. The oscillation device of claim 1, wherein the detection module comprises a temperature sensor and/or a rotational speed sensor, the temperature sensor is configured to detect the temperature of the electronic device, and the rotational speed sensor is configured to detect the rotational speed of the fan.

7. The oscillation device of claim 1, wherein the variable capacitance module comprises a varactor diode and a variable capacitor.

8. The oscillation device of claim 1, wherein the oscillation module comprises a passive crystal oscillator.

9. The oscillation device of claim 1, wherein the variable capacitance module is connected in parallel with the oscillation module.

10. An electronic device, comprising:
    a fan;
    a detection module configured to detect a temperature of the electronic device and/or a rotational speed of the fan;
    an oscillation module configured to oscillate to output a clock signal;
    a variable capacitance module electrically coupled with the oscillation module, a frequency of the clock signal varying with a capacitance of the variable capacitance module; and
    a control module electrically coupled with the detection module, the variable capacitance module, and the oscillation module, and configured to:
    determine a capacitance adjustment parameter according to a preset correspondence, and the temperature of the electronic device and/or the rotational speed of the fan, wherein the preset correspondence comprises a correspondence between the capacitance adjustment parameter and the temperature of the electronic device and/or the rotational speed of the fan, and the capacitance adjustment parameter is configured to change the capacitance of the variable capacitance module; and adjust the capacitance of the variable capacitance module according to the capacitance adjustment parameter.

11. The electronic device of claim 10, wherein the control module configured to determine the capacitance adjustment parameter according to the preset correspondence, and the temperature of the electronic device and/or the rotational speed of the fan is configured to:

determine the capacitance adjustment parameter according to the temperature of the electronic device and the preset correspondence, on condition that the temperature of the electronic device is lower than or equal to a first temperature.

12. The electronic device of claim 10, wherein the control module configured to determine the capacitance adjustment parameter according to the preset correspondence, and the temperature of the electronic device and/or the rotational speed of the fan is configured to:

determine the capacitance adjustment parameter according to the temperature of the electronic device, the rotational speed of the fan, and the preset correspondence, on condition that the temperature of the electronic device is higher than a first temperature.

13. The electronic device of claim 10, wherein the preset correspondence further comprises a correspondence between a fan drive mode, the temperature of the electronic device, the rotational speed of the fan, and the capacitance adjustment parameter, wherein the fan drive mode comprises a pulse width modulation (PWM) signal drive mode and a direct current (DC) signal drive mode.

14. The electronic device of claim 13, wherein the control module is further configured to:

detect the fan drive mode of the electronic device; and
determine the capacitance adjustment parameter according to the fan drive mode of the electronic device, the temperature of the electronic device, the rotational speed of the fan, and the preset correspondence.

15. The electronic device of claim 10, wherein the detection module comprises a temperature sensor and/or a rotational speed sensor, the temperature sensor is configured to detect the temperature of the electronic device, and the rotational speed sensor is configured to detect the rotational speed of the fan.

16. The electronic device of claim 10, wherein the variable capacitance module comprises a varactor diode and a variable capacitor.

17. The electronic device of claim 10, wherein the oscillation module comprises a passive crystal oscillator.

18. The electronic device of claim 10, wherein the variable capacitance module is connected in parallel with the oscillation module.

* * * * *

UNITED STATES PATENT AND TRADEMARK OFFICE
CERTIFICATE OF CORRECTION

| | | |
|---|---|---|
| PATENT NO. | : 11,742,798 B2 | Page 1 of 1 |
| APPLICATION NO. | : 17/692564 | |
| DATED | : August 29, 2023 | |
| INVENTOR(S) | : Chuan He | |

It is certified that error appears in the above-identified patent and that said Letters Patent is hereby corrected as shown below:

On the Title Page

Item (71), "SPREADTRUM COMMUNICATIONS (SHANGHAI) CO., LTD.", Shenzhen (CN);" should read -- SPREADTRUM COMMUNICATIONS (SHENZHEN) CO., LTD.--

Signed and Sealed this
Tenth Day of December, 2024

Katherine Kelly Vidal
*Director of the United States Patent and Trademark Office*